United States Patent
Krumpelman et al.

(10) Patent No.: US 9,218,927 B2
(45) Date of Patent: *Dec. 22, 2015

(54) TOUCHSURFACE ASSEMBLY WITH LEVEL AND PLANAR TRANSLATIONAL RESPONSIVENESS VIA A BUCKLING ELASTIC COMPONENT

(71) Applicant: SYNAPTICS INCORPORATED, Santa Clara, CA (US)

(72) Inventors: Douglas M. Krumpelman, Hayden, ID (US); Cody G. Peterson, Coeur d'Alene, ID (US); Peter Bokma, Coeur d'Alene, ID (US)

(73) Assignee: Synaptics Incorporated, San Jose, CA (US)

( * ) Notice: Subject to any disclaimer, the term of this patent is extended or adjusted under 35 U.S.C. 154(b) by 259 days.

This patent is subject to a terminal disclaimer.

(21) Appl. No.: 13/834,535

(22) Filed: Mar. 15, 2013

(65) Prior Publication Data

US 2014/0034470 A1    Feb. 6, 2014

Related U.S. Application Data

(60) Provisional application No. 61/680,264, filed on Aug. 6, 2012.

(51) Int. Cl.
*H01H 9/26* (2006.01)
*H01H 13/72* (2006.01)
(Continued)

(52) U.S. Cl.
CPC ............ *H01H 13/85* (2013.01); *H03K 17/975* (2013.01); *H03K 17/98* (2013.01); *H01H 2221/036* (2013.01); *H01H 2221/044* (2013.01)

(58) Field of Classification Search
CPC ......... H01H 9/26; H01H 13/72; H01H 13/76; H01H 13/02; H01H 13/14; H01H 13/70; H01H 3/00; H01H 3/02; H01H 3/12; H01H 5/00; H01H 5/04; H01H 13/26; H01H 13/50; H01H 15/00; H01H 2003/12; H01H 2215/004; H01H 2221/00; H01H 2221/01; H01H 2221/036; H01H 2221/088; H01H 2237/004; H01H 2237/008; H01H 2300/046
USPC ......................................................... 200/5 A
See application file for complete search history.

(56) References Cited

U.S. PATENT DOCUMENTS 3,886,341 A    5/1975  Forrest
3,938,642 A    2/1976  Van Rumpt et al.
(Continued)

FOREIGN PATENT DOCUMENTS

CN    102035525 A    4/2011
CN    102832921 A    12/2012
(Continued)

OTHER PUBLICATIONS

"Elastomers: Powerful Polymer", Retrieved from <http://appliancedesign.com/copyright/>, (Jun. 2006),5 pages.
(Continued)

*Primary Examiner* — Edwin A. Leon
*Assistant Examiner* — Anthony R. Jimenez
(74) *Attorney, Agent, or Firm* — Osha Liang LLP

(57) ABSTRACT

Methods and apparatus for a touchsurface assembly such as a key assembly are described. The touchsurface assembly includes a keycap, a base and an elastic component coupled to the keycap and the base. The elastic component supports the keycap away from the base in an unpressed position, and directionally buckles during movement of the keycap toward a pressed position responsive to a press force. The press force moves the keycap in a press direction toward the pressed position, and the directionally buckling of the elastic component allows the keycap to move in a second direction orthogonal to the press direction. Upon release of the press force, the elastic component moves the keycap toward the unpressed position after release of the press force.

19 Claims, 9 Drawing Sheets

(51) Int. Cl.
*H01H 13/76* (2006.01)
*H01H 13/85* (2006.01)
*H03K 17/975* (2006.01)
*H03K 17/98* (2006.01)

(56) References Cited

U.S. PATENT DOCUMENTS

| | | | |
|---|---|---|---|
| 4,039,068 A | 8/1977 | Giorza et al. | |
| 4,056,701 A | 11/1977 | Weber | |
| 4,265,557 A | 5/1981 | Runge | |
| 4,294,555 A | 10/1981 | Galaske et al. | |
| 4,326,195 A | 4/1982 | Seki et al. | |
| 4,334,280 A | 6/1982 | Mcdonald | |
| 4,403,123 A | 9/1983 | Shek | |
| 4,480,162 A | 10/1984 | Greenwood | |
| D278,239 S | 4/1985 | Felix et al. | |
| D284,574 S | 7/1986 | Fischer | |
| D292,801 S | 11/1987 | Davis et al. | |
| 4,735,520 A | 4/1988 | Suzuki et al. | |
| 4,786,766 A | 11/1988 | Kobayashi | |
| 4,885,565 A | 12/1989 | Embach | |
| D312,623 S | 12/1990 | Carter et al. | |
| 5,053,591 A | 10/1991 | Theurer | |
| 5,121,091 A | 6/1992 | Fujiyama | |
| 5,189,390 A | 2/1993 | Fagard | |
| 5,212,473 A | 5/1993 | Louis | |
| 5,239,152 A | 8/1993 | Caldwell et al. | |
| 5,329,278 A | 7/1994 | Dombroski | |
| 5,418,530 A | 5/1995 | Moore et al. | |
| 5,463,195 A | 10/1995 | Watanabe et al. | |
| 5,481,074 A * | 1/1996 | English | 200/5 A |
| 5,523,730 A | 6/1996 | Van Zeeland | |
| 5,575,576 A | 11/1996 | Roysden, Jr. | |
| 5,626,223 A | 5/1997 | Lee | |
| 5,666,096 A | 9/1997 | Van Zeeland | |
| 5,667,061 A | 9/1997 | Lee | |
| 5,763,842 A | 6/1998 | Tsai et al. | |
| 5,767,463 A | 6/1998 | Gandre | |
| 5,828,015 A | 10/1998 | Coulon | |
| 5,867,082 A | 2/1999 | Van Zeeland | |
| 5,902,972 A | 5/1999 | Nestor et al. | |
| 5,921,382 A | 7/1999 | Retter | |
| 5,934,454 A | 8/1999 | Burleson et al. | |
| 5,971,637 A | 10/1999 | Malhi et al. | |
| 5,973,670 A | 10/1999 | Barber et al. | |
| 5,977,867 A | 11/1999 | Blouin | |
| 5,977,888 A | 11/1999 | Fujita et al. | |
| 5,982,304 A | 11/1999 | Selker et al. | |
| 6,039,258 A | 3/2000 | Durbin et al. | |
| 6,046,730 A | 4/2000 | Bowen et al. | |
| 6,067,081 A | 5/2000 | Hahlganss et al. | |
| 6,069,545 A | 5/2000 | Van Zeeland | |
| 6,069,552 A | 5/2000 | Van Zeeland | |
| 6,094,191 A | 7/2000 | Watanabe et al. | |
| 6,118,435 A | 9/2000 | Fujita et al. | |
| 6,130,593 A | 10/2000 | Van Zeeland | |
| 6,166,662 A | 12/2000 | Chuang | |
| 6,218,966 B1 | 4/2001 | Goodwin et al. | |
| 6,219,034 B1 | 4/2001 | Elbing et al. | |
| 6,257,782 B1 | 7/2001 | Maruyama et al. | |
| 6,262,646 B1 | 7/2001 | Van Zeeland | |
| 6,262,717 B1 | 7/2001 | Donohue et al. | |
| 6,305,071 B1 | 10/2001 | Van Zeeland | |
| 6,328,489 B1 | 12/2001 | Chi-Pin | |
| 6,369,692 B1 | 4/2002 | Van Zeeland | |
| 6,369,803 B2 | 4/2002 | Brisebois et al. | |
| 6,373,463 B1 | 4/2002 | Beeks | |
| 6,375,372 B1 | 4/2002 | Tsau | |
| 6,392,515 B1 | 5/2002 | Van Zeeland et al. | |
| 6,400,246 B1 | 6/2002 | Hill et al. | |
| 6,429,846 B2 | 8/2002 | Rosenberg et al. | |
| 6,430,023 B1 | 8/2002 | Suzuki | |
| 6,455,794 B2 | 9/2002 | Sato et al. | |
| 6,466,118 B1 | 10/2002 | Van Zeeland et al. | |
| 6,509,818 B2 | 1/2003 | Van Zeeland | |
| 6,542,058 B2 | 4/2003 | Van Zeeland | |
| 6,556,112 B1 | 4/2003 | Van Zeeland et al. | |
| 6,563,434 B1 | 5/2003 | Olodort et al. | |
| 6,566,616 B1 | 5/2003 | Ha | |
| 6,657,139 B2 | 12/2003 | Hasunuma | |
| 6,677,843 B1 | 1/2004 | Monroe et al. | |
| 6,693,626 B1 | 2/2004 | Rosenberg | |
| 6,723,935 B1 | 4/2004 | Watanabe | |
| 6,723,937 B2 | 4/2004 | Englemann et al. | |
| 6,750,415 B2 | 6/2004 | Yamagami | |
| 6,761,494 B2 | 7/2004 | Hsu et al. | |
| 6,781,077 B2 | 8/2004 | Olodort et al. | |
| 6,819,990 B2 | 11/2004 | Ichinose | |
| 6,822,635 B2 | 11/2004 | Shahoian et al. | |
| 6,880,994 B2 | 4/2005 | Takahashi | |
| 6,911,901 B2 | 6/2005 | Bown | |
| 6,937,124 B1 | 8/2005 | Nakamura et al. | |
| 6,939,065 B2 | 9/2005 | Roysden, Jr. | |
| 6,940,030 B2 | 9/2005 | Takeda et al. | |
| 6,982,617 B2 | 1/2006 | Brilon et al. | |
| D527,004 S | 8/2006 | Yen | |
| 7,094,984 B2 | 8/2006 | Yokoyama | |
| 7,106,305 B2 | 9/2006 | Rosenberg | |
| 7,113,177 B2 | 9/2006 | Franzen | |
| 7,119,798 B2 | 10/2006 | Yoshikawa et al. | |
| 7,148,789 B2 | 12/2006 | Sadler et al. | |
| 7,166,795 B2 | 1/2007 | Lengeling | |
| 7,182,691 B1 | 2/2007 | Schena | |
| 7,196,688 B2 | 3/2007 | Schena | |
| 7,215,329 B2 | 5/2007 | Yoshikawa et al. | |
| 7,224,106 B2 | 5/2007 | Pei et al. | |
| 7,227,537 B2 | 6/2007 | Nakayama et al. | |
| 7,269,484 B2 | 9/2007 | Hein | |
| 7,292,227 B2 | 11/2007 | Fukumoto et al. | |
| 7,312,791 B2 | 12/2007 | Hoshino et al. | |
| 7,324,094 B2 | 1/2008 | Moilanen et al. | |
| 7,336,266 B2 | 2/2008 | Hayward et al. | |
| 7,339,572 B2 | 3/2008 | Schena | |
| 7,342,573 B2 | 3/2008 | Ryynanen | |
| 7,375,656 B2 | 5/2008 | Muller et al. | |
| 7,385,308 B2 | 6/2008 | Yerdon et al. | |
| 7,400,319 B2 | 7/2008 | Nakayama et al. | |
| 7,450,110 B2 | 11/2008 | Shahoian et al. | |
| 7,525,415 B2 | 4/2009 | Yatsu et al. | |
| 7,548,232 B2 | 6/2009 | Shahoian et al. | |
| 7,567,232 B2 | 7/2009 | Rosenberg | |
| 7,569,786 B2 | 8/2009 | Spies | |
| 7,573,460 B2 | 8/2009 | Strawn et al. | |
| 7,579,758 B2 | 8/2009 | Maruyama et al. | |
| 7,589,607 B2 | 9/2009 | Rochon et al. | |
| 7,592,901 B2 | 9/2009 | Furusho | |
| 7,592,999 B2 | 9/2009 | Rosenberg et al. | |
| 7,602,384 B2 | 10/2009 | Rosenberg et al. | |
| 7,607,087 B2 | 10/2009 | Prados | |
| 7,701,440 B2 | 4/2010 | Harley | |
| 7,855,715 B1 | 12/2010 | Bowen | |
| 7,868,515 B2 | 1/2011 | Krochmal et al. | |
| 7,898,440 B2 | 3/2011 | Chen | |
| 7,969,288 B2 | 6/2011 | Braun et al. | |
| 7,982,720 B2 | 7/2011 | Rosenberg et al. | |
| 8,031,181 B2 | 10/2011 | Rosenberg et al. | |
| 8,059,105 B2 | 11/2011 | Rosenberg et al. | |
| 8,094,130 B2 | 1/2012 | Griffin et al. | |
| 8,199,033 B2 | 6/2012 | Peterson et al. | |
| 8,203,531 B2 | 6/2012 | Peterson et al. | |
| 8,217,289 B2 | 7/2012 | Liu | |
| 8,222,799 B2 | 7/2012 | Polyakov et al. | |
| 8,232,969 B2 | 7/2012 | Grant et al. | |
| 8,248,277 B2 | 8/2012 | Peterson et al. | |
| 8,248,278 B2 | 8/2012 | Schlosser et al. | |
| 8,274,478 B2 | 9/2012 | Bowen | |
| 8,309,870 B2 | 11/2012 | Peterson et al. | |
| 8,310,351 B2 | 11/2012 | Krahenbuhl et al. | |
| 8,310,444 B2 | 11/2012 | Peterson et al. | |
| 8,451,426 B2 | 5/2013 | Iino | |
| 8,648,737 B1 | 2/2014 | Bowen | |
| 8,674,941 B2 | 3/2014 | Casparian et al. | |
| 2001/0002648 A1 | 6/2001 | Van Zeeland | |
| 2002/0054060 A1 | 5/2002 | Schena | |

(56) References Cited

U.S. PATENT DOCUMENTS

| | | |
|---|---|---|
| 2002/0084721 A1 | 7/2002 | Walczak |
| 2002/0149561 A1 | 10/2002 | Fukumoto et al. |
| 2003/0067449 A1 | 4/2003 | Yoshikawa et al. |
| 2003/0209131 A1 | 11/2003 | Asahi |
| 2003/0210233 A1 | 11/2003 | Frulla |
| 2004/0252104 A1 | 12/2004 | Nakamura et al. |
| 2005/0017947 A1 | 1/2005 | Shahoian et al. |
| 2005/0089356 A1 | 4/2005 | Jung-Tsung |
| 2005/0157893 A1 | 7/2005 | Pelrine et al. |
| 2005/0204906 A1 | 9/2005 | Lengeling |
| 2005/0237309 A1 | 10/2005 | Sharma |
| 2006/0232559 A1 | 10/2006 | Chien et al. |
| 2006/0256075 A1 | 11/2006 | Anastas et al. |
| 2006/0261983 A1 | 11/2006 | Griffin et al. |
| 2007/0031097 A1 | 2/2007 | Heikenfeld et al. |
| 2007/0080951 A1 | 4/2007 | Maruyama et al. |
| 2007/0091070 A1 | 4/2007 | Larsen et al. |
| 2007/0146317 A1 | 6/2007 | Schena |
| 2007/0146334 A1 | 6/2007 | Inokawa |
| 2007/0152974 A1 | 7/2007 | Kim et al. |
| 2007/0165002 A1 | 7/2007 | Wassingbo |
| 2007/0193436 A1 | 8/2007 | Chu |
| 2007/0199804 A1* | 8/2007 | Joseph et al. .......... 200/5 A |
| 2007/0205988 A1 | 9/2007 | Gloyd et al. |
| 2007/0234887 A1 | 10/2007 | Sawada et al. |
| 2007/0234890 A1 | 10/2007 | Yamashita |
| 2007/0236449 A1 | 10/2007 | Lacroix et al. |
| 2007/0236450 A1 | 10/2007 | Colgate et al. |
| 2008/0007529 A1 | 1/2008 | Paun et al. |
| 2008/0042980 A1 | 2/2008 | Bowen |
| 2008/0062015 A1 | 3/2008 | Bowen |
| 2008/0083314 A1 | 4/2008 | Hayashi et al. |
| 2008/0084384 A1 | 4/2008 | Gregorio et al. |
| 2008/0087476 A1 | 4/2008 | Prest et al. |
| 2008/0092720 A1 | 4/2008 | Yamashita et al. |
| 2008/0100568 A1 | 5/2008 | Koch et al. |
| 2008/0165127 A1 | 7/2008 | Eom |
| 2008/0289952 A1 | 11/2008 | Pelrine et al. |
| 2008/0302647 A1 | 12/2008 | Villain et al. |
| 2008/0303782 A1 | 12/2008 | Grant et al. |
| 2009/0002205 A1 | 1/2009 | Klinghult et al. |
| 2009/0072662 A1 | 3/2009 | Sadler et al. |
| 2009/0073128 A1 | 3/2009 | Marsden |
| 2009/0079593 A1 | 3/2009 | Yamakawa et al. |
| 2009/0088220 A1 | 4/2009 | Persson |
| 2009/0128501 A1 | 5/2009 | Lazaridis et al. |
| 2009/0178913 A1 | 7/2009 | Peterson et al. |
| 2009/0189790 A1 | 7/2009 | Peterson et al. |
| 2009/0189873 A1 | 7/2009 | Peterson et al. |
| 2009/0210568 A1 | 8/2009 | Peterson et al. |
| 2009/0231277 A1 | 9/2009 | Peterson et al. |
| 2009/0255793 A1 | 10/2009 | Krochmal et al. |
| 2010/0171715 A1 | 7/2010 | Peterson et al. |
| 2010/0231423 A1 | 9/2010 | Yang |
| 2010/0245231 A1 | 9/2010 | Aramaki |
| 2010/0253629 A1 | 10/2010 | Orsley |
| 2010/0259481 A1 | 10/2010 | Oh |
| 2010/0309130 A1 | 12/2010 | Zhao et al. |
| 2010/0321301 A1 | 12/2010 | Casparian et al. |
| 2010/0328251 A1 | 12/2010 | Sinclair |
| 2011/0025607 A1 | 2/2011 | Bowen |
| 2011/0095919 A1 | 4/2011 | Ostermoller et al. |
| 2011/0096013 A1 | 4/2011 | Krumpelman et al. |
| 2011/0128239 A1 | 6/2011 | Polyakov et al. |
| 2011/0203912 A1 | 8/2011 | Niu |
| 2011/0205161 A1 | 8/2011 | Myers et al. |
| 2011/0227762 A1 | 9/2011 | Bowen |
| 2011/0227872 A1 | 9/2011 | Huska et al. |
| 2011/0234494 A1 | 9/2011 | Peterson et al. |
| 2012/0019445 A1 | 1/2012 | Liu |
| 2012/0043191 A1 | 2/2012 | Kessler et al. |
| 2012/0092263 A1 | 4/2012 | Peterson et al. |
| 2012/0119996 A1 | 5/2012 | Wu et al. |
| 2012/0169603 A1 | 7/2012 | Peterson et al. |
| 2012/0268384 A1 | 10/2012 | Peterson et al. |
| 2012/0299832 A1 | 11/2012 | Peterson et al. |
| 2013/0082932 A1 | 4/2013 | Gluckstad et al. |
| 2013/0093681 A1 | 4/2013 | Hsu |
| 2013/0135207 A1 | 5/2013 | Neil et al. |
| 2013/0314325 A1 | 11/2013 | Furukawa |
| 2013/0342494 A1 | 12/2013 | Feng |
| 2014/0001021 A1 | 1/2014 | Zhang |
| 2014/0034468 A1 | 2/2014 | Krumpelman et al. |
| 2014/0055363 A1 | 2/2014 | Meierling et al. |

FOREIGN PATENT DOCUMENTS

| | | |
|---|---|---|
| CN | 202694270 U | 1/2013 |
| DE | 19704253 A | 8/1998 |
| DE | 10126670 A1 | 12/2002 |
| DE | 2005002417 A | 4/2005 |
| DE | 2004005501 A | 8/2005 |
| EP | 0278916 A | 8/1988 |
| EP | 1548776 A | 6/2005 |
| EP | 2287873 A | 2/2011 |
| JP | 2000348562 A | 12/2000 |
| JP | 2007173087 A | 7/2007 |
| JP | 2011233406 A | 11/2011 |

OTHER PUBLICATIONS

"Haptic Touch Technology", Pacinian,(Nov. 2007),2 pages.

"Haptics: Learning Through Touch", Retrieved from <http://ced.ncsu.edu/nanoscale/haptics.htm>, (2004),5 pages.

"International Search Report and Written Opinion", Application No. PCT/US2010/020380, (Apr. 12, 2010),10 pages.

"Nanoactuators Based on Electrostatic Forces on Dielectrics", Retrieved from <http://www.nasatech.com/Briefs/Apr05/NPO30747.html>on Nov. 28, 2005, NASA's Jet Propulsion Laboratory, Pasadena, CA,4 pages.

New SRI International sSpin-Off, Artificial Muscle, Inc., Secure Series a Funding from Leading VC Firms, Retrieved from <http://www.sri.com/news/releases/05-03-04.html> on Jan. 30, 2008, SRI International Spin Offs Artificial Muscle, Inc,(May 2004),2 pages.

"Non-Final Office Action mailed Dec. 9, 2011", U.S. Appl. No. 12/580,002, 21 pages.

"Proposed Experiment Protocol and Details", Retrieved from <http://bdml.stanford.edu/wiki/bin/view/Haptics/ProposedExperiOmentPr- otocolAndDetails>, 5 pages.

"Tactile Perception and Design", Retrieved from http://www.tireesias.org/reports.tpd2.htm on Apr. 4, 2006, 10 pages.

"Touch and Haptics", 2004 IEEE/ RSJ International Conference on Intelligent Robots and Systems, (Sep. 28, 2004),32 pages.

"Touch-Hapsys", Retrieved from <http://www.touch-hapsys.org>, 2 pages.

Ashley, Steven "Artificial Muscles", Scientific American, Available at <www.sciam.com>,(Oct. 2003),pp. 53-59.

Bar-Cohen, Y. "Electroactive Polymer (EAP) Actuators as Artificial Muscles—Reality, Potential and Challenges", SPIE Press, (Mar. 18, 2004),pp. 26 and 548-550.

Bar-Cohen, Yoseph "Electric Flex", IEEE Spectrum Online, (Jun. 2004),6 pages.

Bar-Cohen, Yoseph "Electroactive Polymers as Artificial Muscles—Capabilities, Potentials and Challenges", Robotics 2000, Available at <www.spaceandrobotics>,(Feb. 28-Mar. 2, 2000),pp. 1-8.

Bar-Cohen, Yoseph "Electroactive Polymers", Retrieved from <http://electrochem.cwru.edu/ed/encycl/>, Electrochemistry Encyclopedia,(Dec. 2004),7 pages.

Bar-Cohen, Yoseph "Low Mass Muscle Actuators (LoMMAs)", Telerobotic Task Sponsored by NASA HQ, Code S, (Oct. 23, 1997),18 pages.

Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.

Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.

Bark, Karlin "Functional Prototype I", Retrieved from <http://bdml.stanford.edu/twiki/bin/view/Haptics/FunctionalPrototypeI?- skin=print.pattern>, (Aug. 9, 2005),3 pages.

(56) References Cited

OTHER PUBLICATIONS

Beavers, Alex "Basic Concepts for Commercial Applications of Electroactive Polymer Artificial Muscle", Artificial Muscle Incorporated, Menlo Park, CA,10 pages.
Bicchi, Antonio et al., "Haptic Illusions Induced by the Tactile Flow", Interdepartmental Research Centre "E. Piaggo", University of Pisa,12 pages.
Bifano, Thomas "Parallel Plate Electrostatic Actuation for High-Resolution Deformable Mirrors", Boston University, (Aug. 19, 2004),35 pages.
Bifano, Thomas, "Parallel Plate Electrostatic Actuation for High-Resolution Deformable Mirrors", Boston University, Boston, MA, Aug. 19, 2004.
Biggs, James "Some Useful Information for Tactile Display Design", IEEE Transactions on Man-Machine Systems, vol. 11, No. 1,(1970),pp. 19-24.
Carpi, Federico et al., "Dielectric Elastomers as Electromechanical Transducers: Fundamentals, Materials, Devices, Models and Applications of an Emerging Elecrotactive Polymer Technology", Elsevier Ltd., (2008),12 pages.
Fontaine, Ebraheem "A Laboratory Demonstration of a Parallel Robotic Mechanism", Massachusetts Institute of Technology,(Jun. 2002),pp. 1-14.
Fukumoto, Masaki, et al, "Active Click: Tactile Feedback for Touch Panels", NTT DoCoMo Multimedia Labs, Mar. 31, 2001, 2 pages.
Gorinevsky, Dimitry "Adaptive membrane for large lightweight space telescopes", SPIE Astronomical Telescopes and Instrumentation,(2002),pp. 1-9.
Hayward, Vincent et al., "Tactile Display Device Using Distributed Lateral Skin Stretch", Proceedings of the Haptic Interfaces for Virtual Environment and Teleoperator Systems Symposium, ASME International Mechanical Engineering Congress & Exposition,(2000),pp. 1309-1314.
Hollis, Ralph "Haptics", Berkshire Encyclopedia of Human-Computer Interaction, Berkshire Publishing Group,(2004), pp. 311-316.
Jager, Edwin et al., "Microfabricating Conjugated Polymer Actuators", Science Magazine, vol. 290, www.sciencemag.org,(Nov. 24, 2000),pp. 1540-1544.
Jones, Gail et al., "A Comparison of Learning with Haptic and Visual Modalities", National Science Foundation REC-0087389,pp. 1-20.
Jones, Lynette "Human Factors and Haptic Interfaces", Department of Mechanical Engineering, Massachusetts Institute of Technology,40 pages.
Jungmann, M., et al, Miniaturised Electrostatic Tactile Display with High Structural Compliance, 2002, 6 pages.
Kajimoto, Hiroyuki et al., "Electro-Tactile Display with Tactile Primary Color Approach", Graduate School of Information and Technology, The University of Tokyo,2 pages.
Mackenzie, Scott, et al, "The Tactile Touchpad", 1997, 5 pages.
Mackenzie, Scott, et al., "A Comparison of Three Selection Techniques for Touchpads", Proceedings of the CHI'98 Conference on Human Factors in Computing Systems, pp. 336-343 New York 1998.
Mok Ha, Soon et al., "Interpenetrating Polymer Networks for High-Performance Electroelastomer Artificial Muscles", Department of Materials Science and Engineering, UCLA,pp. 1-19.
Non-Final Office Action mailed Feb. 13, 2009, U.S. Appl. No. 11/945,879.
Odell, D.L. et al., "MicroRobot Conveyance and Propulsion System Using Comb Drive and Parallel Plate Actuators: the ScuttleBot", UC Berkley,4 pages.
O'Halloran, A et al., "Materials and Technologies for Artificial Muscle: A Review for the Mechatronic Muscle Project", Topics in Bio-Mechanical Engineering, Chapter 7, Department of Electronic Engineering, National University of Ireland Galway,(2004),pp. 184-215.
Oniszczak, Aleks, "VersaPad Driver Plus Pack", 1999, 3 pages.
Pasquero, Jerome "Stimulation of the Fingertip by Lateral Skin Strech", Retrieved from <http://www.cim.mcgill.ca/.about.jay/index.sub.--files/research.htm>- ;, 5 pages.
Pasquero, Jerome "Stress: A Tactile Display Using Lateral Skin Stretch", Department of Electrical and Computer Engineering McGill University, Montreal,(Oct. 2003),75 pages.
Pasquero, Jerome "Survey on Communication Through Touch", Technical Report: TR-CIM 06.04, Center for Intelligent Machines Department of Electrical and Computer Engineering,(Jul. 2006),pp. 1-27.
Pasquero, Jerome "Tactile Display Survey", Technical Report TR-CIM 06.04,6 pages.
Pei, Qibing et al., "Multiple-Degrees-of-Freedom Electroelastomer Roll Actuators", SRI International Institute of Physics Publishing, (2004),pp. N86-N92.
Poupyrev, Ivan, et al., "Tactile Interfaces for Small Touch Screens", 2003, 4 pages.
Poupyrev, Ivan, et al., "TouchEngine: A Tactile Display for Handheld Devices", 2002, 2 pages.
Raisamo, Roope "Tactile User Interfaces", New Interaction Techniques,(Aug. 2, 2001),30 pages.
Seeger, Joseph et al., "Dynamics and Control of Parallel-Plate Actuators Beyond the Electrostatic Instability", Transducers "99 the 10th International Conference on Solid State Sensors and Actuators, (Jun. 1999),pp. 474-477.
Sommer-Larsen, Peter "Artificial Muscles", Rise National Laboratory, Condensed Matter Physics and Chemistry Department,3 pages.
Spires, Shelby "Artificial Strongman", Smart Business: For the New Economy, (Nov. 2000),1 page.
Srinivasan, Mandayam A., et al, "Role of Skin Biomechanics in Mechanoreceptor Response", Retrieved from <http://touchlab.mit.edu/oldresearch/currentwork/humanhaptics/roleofsk-inbiomechanics/> on Dec. 20, 2007, MIT Touch Lab, (Dec. 20, 2007),pp. 1-13.
Supplemental Notice of Allowance mailed May 20, 2010, U.S. Appl. No. 11/945,879, 5 pages.
Wagner, Christopher et al., "Integrating Tactile and Force Feedback with Finite Element Models", Division of Engineering and Applied Sciences, Harvard University,6 pages.
Wagstaff, Jeremy, "A Passion for the Keys", The Wall Street Journal Online, Nov. 23, 2007, 3 pages, retrieved from the Internet at online.wsj.com/article_print/SB119578337324301744.html.
Wing, Alan et al., "Multidimensional Haptics Preliminary Report", Retrieved from <http://www.touch-hapsys.org>, (Sep. 21, 2003),pp. 1-125.
Wingert, Andreas et al., "On the Kinematics of Parallel Mechanisms with Bio-stable Polymer Actuators", Department of Mechanical Engineering, Massachusetts Institute of Technology Cambridge,8 pages.
Wu, Xingtao et al., "A Generalized Capacitance-Based Model for Electrostatic Micro-Actuators", Department of Physics, New Jersey Institute of Technology, Newark, NJ, 07102-1982 Department of Mechanical Engineering, Columbia University, NY 10027, pp. 1-23.
Yang, Gi-Hun, "Novel Haptic Mouse System for Holistic Haptic Display and Potential of Vibrotactile Stimulation", Human-Robot Interaction Research Center, Korea Advanced Institute of Science and Technology, 2005, 17 pages.
Zou, Jun et al., "Design of a Wide Turning Range Micromachined Turnable Capacitor for Wireless Communications", First IEEE Electro/Information Technology Conference, Jun. 8-11, Chicago, IL, 2000, 6 pages.
Non-Final Office Action mailed May 14, 2012, U.S. Appl. No. 13/323,292, 19 pages.
Final Office Action mailed Aug. 1, 2012 for U.S. Appl. No. 12/580,002, 23 pages.
Korean Intellectual Property Office, International Searching Authority, Search Report and Written Opinion for International Application No. PCT/US2013/053610, mailed Jan. 13, 2014.

* cited by examiner

TOUCHSURFACE ASSEMBLY WITH LEVEL AND PLANAR TRANSLATIONAL RESPONSIVENESS VIA A BUCKLING ELASTIC COMPONENT

RELATED APPLICATION(S)

This application claims the benefit of U.S. Provisional Application No. 61/680,264 filed Aug. 6, 2012.

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key (a reaction force resisting a press of the key by the user) and the amount of key displacement (movement relative to its unpressed position). The force applied to the user may be a total force or the portion of the total force along a particular direction such as the positive or negative press direction. Similarly, the amount of key travel may be a total amount of key displacement or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

BRIEF SUMMARY OF THE INVENTION

Methods and apparatus for a touchsurface assembly such as a key assembly are described. The touchsurface assembly includes a keycap, a base and an elastic component coupled to the keycap and the base. The elastic component supports the keycap away from the base in an unpressed position, and directionally buckles during movement of the keycap toward a pressed position responsive to a press force. The press force moves the keycap in a press direction toward the pressed position, and the directionally buckling of the elastic component allows the keycap to move in a second direction orthogonal to the press direction. Upon release of the press force, the elastic component moves the keycap toward the unpressed position after release of the press force.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
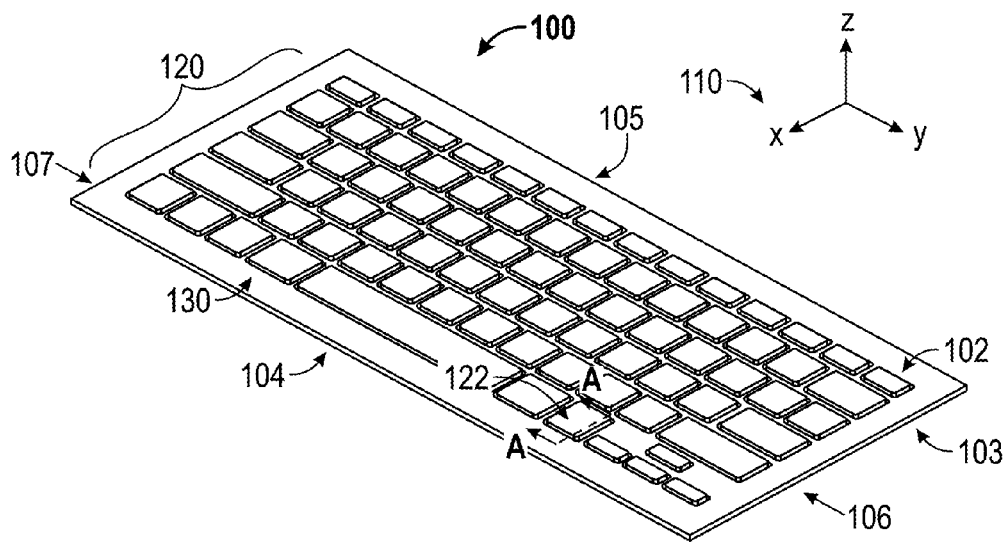
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into a laptop computer comprising one or more processing systems formed from one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
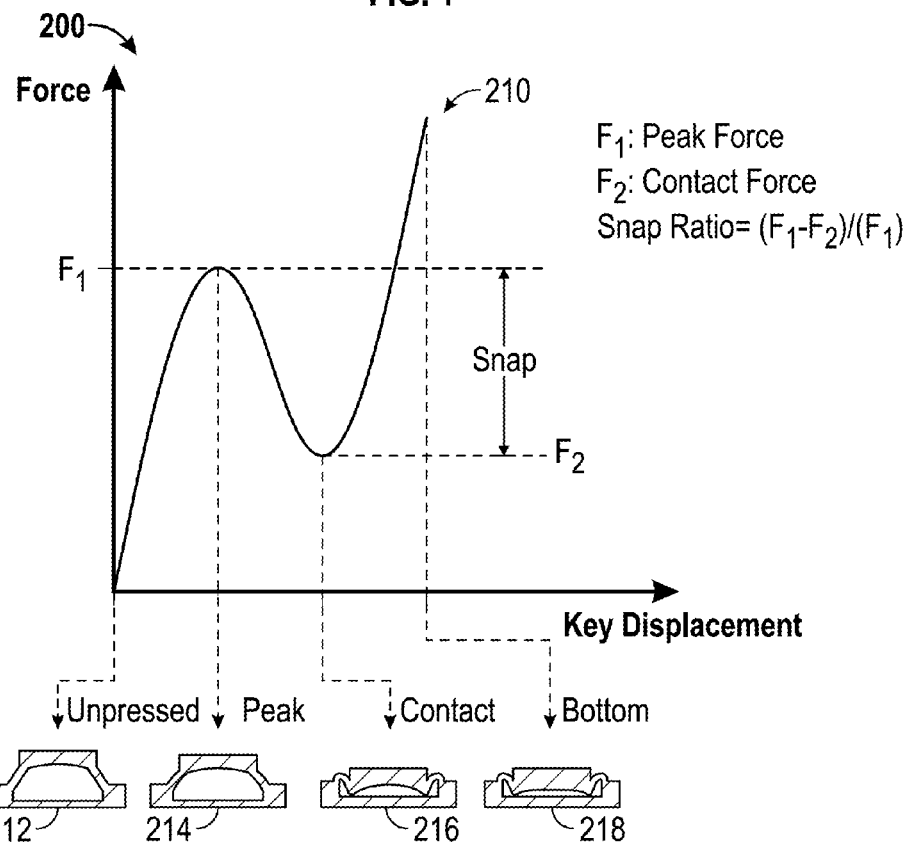
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
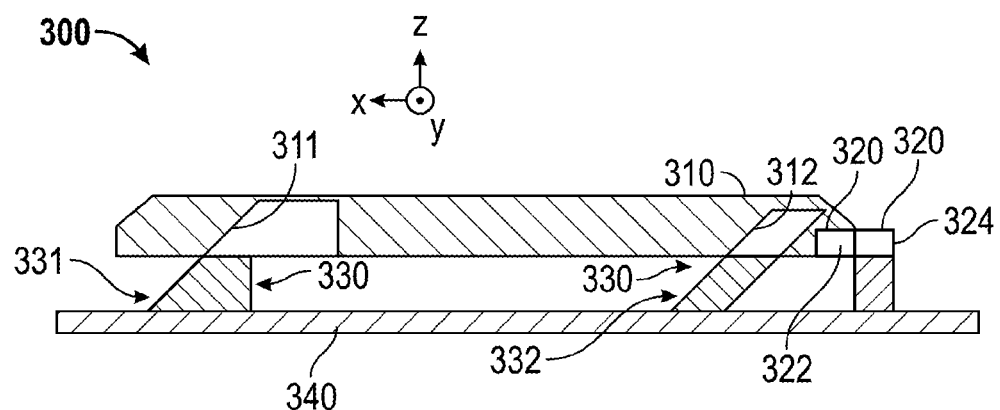
FIGS. 3A-3B are simplified side views of a first example touchsurface assembly configured in accordance with the techniques described herein.
Figure 3B:
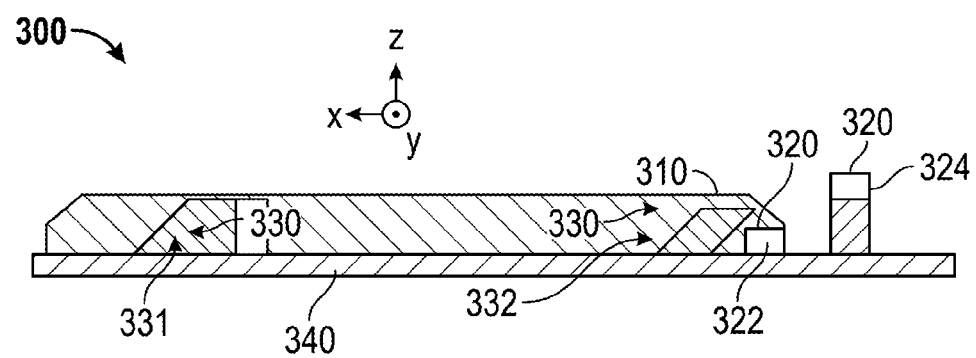

FIGS. 3A-3B are simplified cross-sectional views of a first example touchsurface assembly. The key assembly 300 may be used to implement various keys, including the key 122 of the keyboard 100. In the embodiment where FIGS. 3A-B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 324 is physically attached to the keycap and magnetically interacts with the magnetically coupled component 322. The physical attachment of the magnetically coupled components 322, 324 may be direct or indirect (via one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 is urged to move in the press direction (negative Z-direction) in response to a press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. For example, in the exemplary embodiments of FIGS. 6-10, a buckling elastomer mechanism (or elastic component) is used alone or with the magnetically coupled components 322, 324 as the biasing and/or ready/return mechanism. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
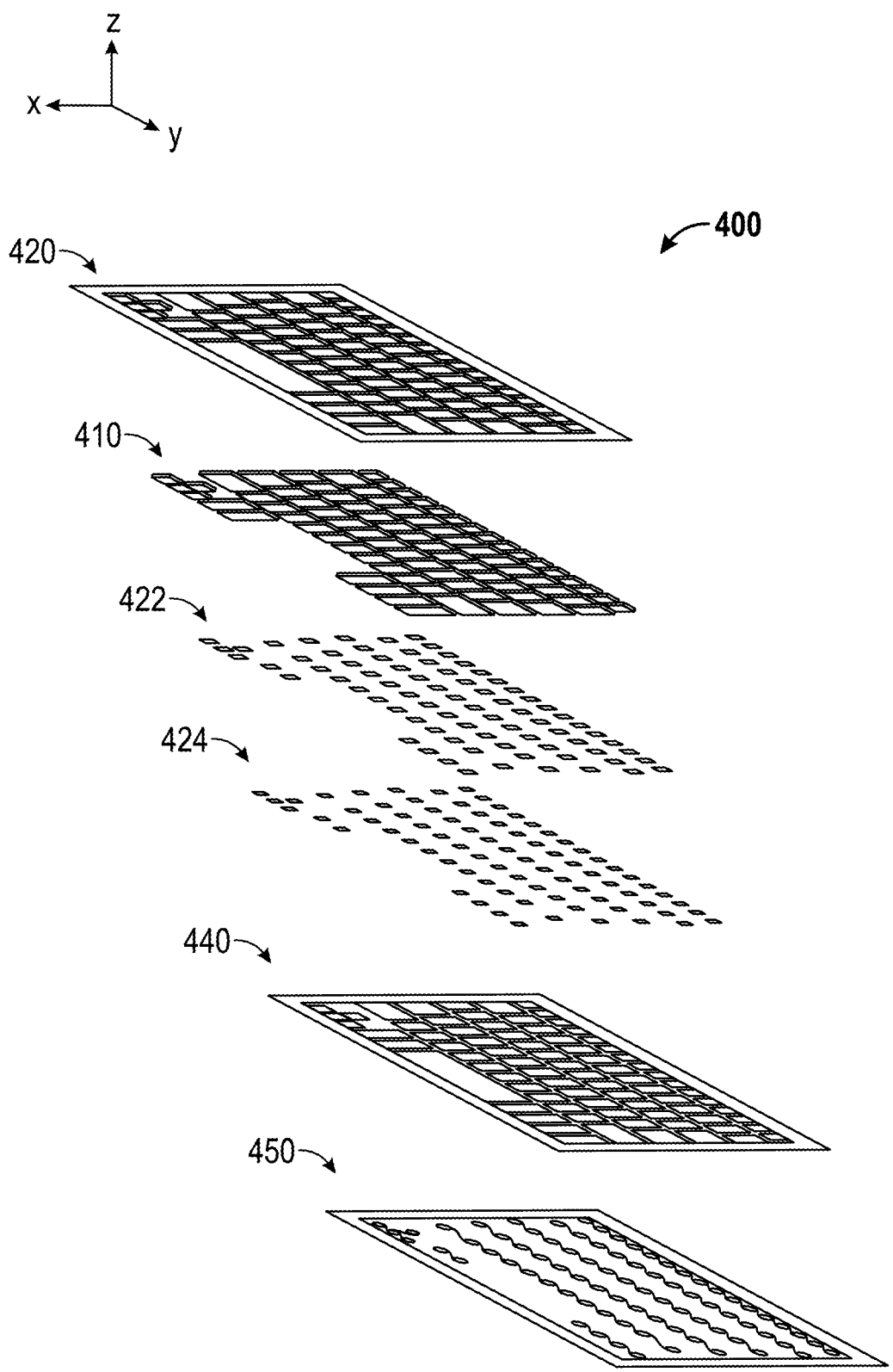
FIG. 4 shows an exploded view of an example keyboard in accordance with the techniques described herein

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5A:
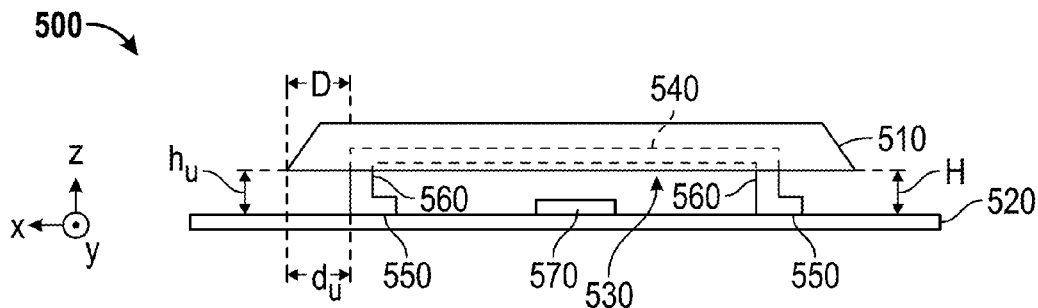
FIGS. 5A-B show simplified side of an example touchsurface assembly according to an embodiment.
Figure 5B:
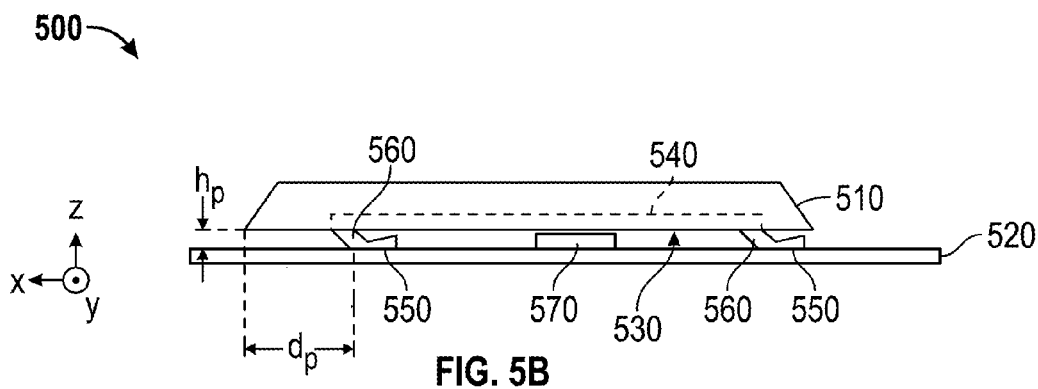

FIGS. 5A-B show simplified side and cross-sectional views of a second example touchsurface assembly. Specifically, FIGS. 5A-b show a key assembly 500 that may be used to enable the key 122 of the keyboard 100. The key assembly 500 may also be used in other devices utilizing keys, including keyboards other than the keyboard 100 and any other appropriate key-using device. Further, assemblies analogous to the key assembly 500 may be used to enable non-key touchsurface assemblies with pressable touchsurfaces, such as buttons, opaque touchpads, touchscreens, or any of the touchsystems described herein.

The coordinate system indicated in FIGS. 5A-B is analogous to the coordinate system shown for FIGS. 3A-B. FIG. 5A illustrates a side view of the key assembly 500 in an unpressed position, and FIG. 5B illustrates a side view of the key assembly 500 in a pressed position.

The key assembly 500 comprises a keycap 510 that is visible to users and configured to be pressed by users in a press direction toward a base 520. In the exemplary embodiment of FIGS. 5A-B, an elastic component 530 directionally buckles in response to particular input and provides the functions of a ready/return mechanism. That is, unlike the collapsing of circular domes, the elastic component buckles in an asymmetric way and moves in a lateral direction orthogonal to the press direction.

In some embodiments, the elastic component comprises an elastomer such as urethane or silicone, and be termed a "buckling elastomeric mechanism." In some embodiments, the elastic component 530 allows but does not cause lateral translation of the keycap 510, and the key assembly 500 comprises a separate planar translation effecting (PTE) mechanism (e.g., the keycap follows guides directing the keycap in the lateral direction). In some embodiments, the elastic component 530 causes part or all of the lateral translation of the keycap 510, and provides the function of a PTE mechanism. As will be appreciated, the functionality of the components of key assembly 300 (FIGS. 3A-B) may be readily analogized to the similar functionality of the key assembly 500. For example, the keycap 510 is configured to move between an unpressed position (FIG. 5A) and a pressed position (FIG. 5B).

The unpressed and pressed positions of the keycap 510 may be characterized by the vertical spacing "H" between a bottom of the keycap 510 and a top of the base 520 and a lateral spacing "D" between an edge of the keycap 510 and an arbitrary reference fixed relative to the base 520. The unpressed position is associated with the distances $h_u$ and $d_u$, and the pressed position is associated with the distances $h_p$ and $d_p$. Thus, the unpressed and pressed positions of the touchsurface of the keycap 510 are separated in a press direction (negative-Z direction) by a first amount ($h_u - h_p$) and in a lateral direction (positive-X direction) by a second amount ($d_u - d_p$). The lateral direction is orthogonal to the press direction. These first and second amounts may have any ratio allowed by the physical constraints of the assembly. One may be many times the other, for example. In some embodiments, the first amount in the press direction is at least as much as the second amount in the lateral direction, and the first amount is no larger than twice the second amount.

The elastic component 530 may also be termed a biasing mechanism since it is configured to bias the keycap 510 away from the base 520. Various embodiments of the elastic component 530 are provided in connection with FIGS. 6-10 below, but generally, the elastic component 530 includes a keycap portion 540 coupled to a first face (often a bottom face) of the keycap 510. Where the keycap 510 has a concave bottom face, the keycap portion 540 may be mounted flush with the bottommost features of the keycap 510, or may be mounted in a recessed area as illustrated in FIG. 5A. The elastic component 530 further comprises two base portions 550 that are coupled to the base 520.

The keycap portion 540 may be physically coupled to the keycap 510 and the base portions 550 may be coupled to the base 520 by any appropriate method, including coupled directly or indirectly through one or more intermediate components, attached by application of liquid or film adhesive, heat staking, clamping, or co-molding, and the like. Further, the face of the keycap portion 540 contacting the keycap 510 may be partially or wholly fixed with respect to the keycap 510. The un-fixed section of a partially fixed face of the keycap portion 540 may move relative to the keycap 510, such as by moving away from the keycap 510 in response to movement of the keycap 510 between the pressed and unpressed positions. Similarly, the face of the base portion 550 contacting the base 520 may be partially or wholly fixed with respect to the base 520.

In various embodiments, partial attachment close to the intermediate portion 560 facilitate directional buckling of the elastic component by reducing the force needed to cause buckling, or by promotion buckling in a certain manner that causes directional buckling. As a specific example, some embodiments of elastic components comprise a base portion that comprises a distal end attached to a base and a proximal end not attached to the base. The distal and proximal relationship is based on the corresponding intermediate portion of the elastic component, such that the distal end is farther from the intermediate portion and the proximal end is closer to the intermediate portion. When buckled, the proximal end lifts away from the base.

Intermediate portions 560 are located between the keycap portion 540 and the base portion 560, and in the unpressed position illustrated in FIG. 5A, the elastic component 530 biases the keycap 510 to be supported in a ready position away from the base 520.

Upon application of a press force, the elastic component 530 provides a reaction force opposing the press force. The press force is typically applied in a press direction toward the pressed position, and the reaction force typically impedes keycap 510 travel until the press force is sufficient to cause the intermediate portion 560 of the elastic component 530 to directionally buckle in a second direction orthogonal to the press direction. In some embodiments of the key assembly 500 where the directional buckling action provides PTE function, the buckling effects planar translation for the keycap 510 in the lateral direction separating the unpressed and pressed positions. As illustrated in FIG. 5B, the directional buckling is in the positive X direction with reference to the coordinate system shown. In some embodiments, in response to a removal of the press force, the elastic component 530 applies forces that bias the keycap 510 toward the unpressed position.

In some embodiments, the key assembly 500 also comprises a sensor 570 for detecting the pressed state of the keycap 510. The sensor may use any appropriate technology, including any of the ones described herein. In some embodiments, the sensor 570 detect changes in capacitance, the keycap 510 comprises primarily dielectric material, and the change in the position of the dielectric material of the keycap 510 causes the primary changes in capacitance detected by the sensor 570. In some embodiments, the sensor 570 detect changes in capacitance, conductive material is disposed in or on the keycap 510, and the change in position of the conductive material of the keycap 510 causes the primary changes in capacitance detected by the sensor 570. In some embodiments, the senor 570 is configured to actively detect unpressed and pressed positions of the keycap 510. In some embodiments, the sensor 570 is configured to actively detect only the pressed state of the keycap 510, and it is assumed that no detection of the pressed state means the keycap 510 is unpressed, or vice versa. A processing system (not shown) communicatively coupled to the sensor 570 operates the sensor 570 to produce signals indicative of the press state of the key assembly 500, and determines a press state of the keycap 510 based on these signals.

Many variations of the elastic component 530 are contemplated and several exemplary embodiments are illustrated below in connection with FIGS. 6-10. Although most of the embodiments discussed in connection with FIGS. 5-11 are presented in association with key assemblies and keyboards, they are readily applied to non-key-based touchsurface assemblies.

Some embodiments of devices in accordance with the techniques described herein comprise multiple elastic components. These elastic components may be matched to touchsurfaces in a variety of ways. They may be matched in a one-to-one manner, such that a single touchsurface corresponds to a single elastic component and vice versa. Or, these elastic components may be matched to touchsurfaces in a many-to-one manner, such that multiple elastic components are dedicated to a single touchsurface; this many-to-one approach may be applied to any appropriate touchsurface, but may be more common for larger touchsurfaces, touchsurfaces requiring increased readying force or return force, or touchsurfaces having large aspect ratios or complex shapes. For example, space bars of keyboards, which often have aspect ratios of 4:1 to 7:1, two or more elastic components may be used in parallel, spaced in a direction orthogonal to the lateral direction of buckling.

These elastic components may also be matched to touchsurfaces in a one-to-many manner, such that one elastic component supports many touchsurfaces; this one-to-many approach may be applied to any appropriate set of touchsurfaces, but may be more common where the touchsurfaces are expected to be pressed one at a time, and not in combination. Or, these elastic components may be matched to touchsurfaces in a many-to-many manner, such that multiple elastic components are shared among multiple keys in an overlapped way.

Figure 6A:
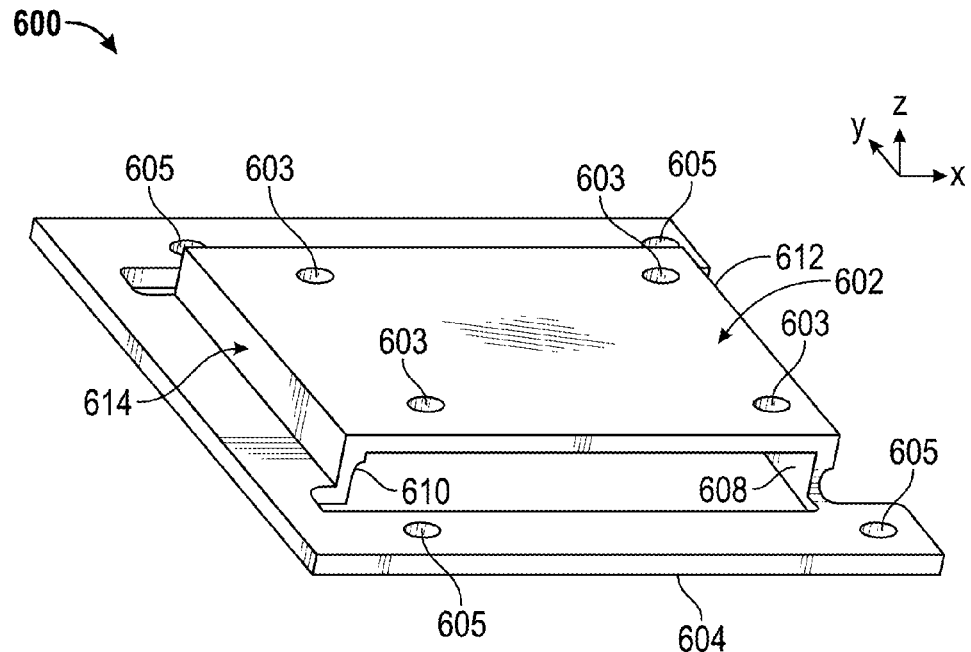
FIGS. 6A-D shows a perspective view and side views of the elastic component of FIGS. 5A-B according to an embodiment.

FIG. 6A illustrates a perspective view of an embodiment of an elastic component 600 that may be used to provide biasing function in various touchsurface assemblies, such as key assemblies. The elastic component 600 includes a keycap portion 602, a base portion 604 and first and second intermediate portions (608 and 610). The keycap portion 602 has a first edge 612 and a second edge 614. The first intermediate portion 608 couples to or joins with the keycap portion 602 near to or along this first edge 612, and the first intermediate portion 608 then extends down to the base 604. In a similar arrangement, the keycap portion 602 couples to or joins with the second intermediate portion 610 near to or along the second edge 614, and the second intermediate portion 610 then extends down to the base 604.

In some embodiments, the elastic component 600 is constructed as an individual component physically separate from other elastic components. For some embodiments of a device utilizing multiple elastic components, such single elastic components are individually applied to a base (such as base 520 of FIG. 5) in a configuration that depends upon the type and arrangement of the touchsurface aggregation to be realized. For example, numeric keypads or alphanumeric keyboards may be realized with physically separate, individual elastic components. In other embodiments, the elastic component 600 is formed as one of a plurality of elastic components formed in a sheet of elastic material and applied to a base as a single or multiple sheets to provide the touchsurface arrangement to be realized. Often, the elastic component(s) 600 are coupled to the base using a liquid or film adhesive; however, other coupling mechanisms or agents, such as heat staking, clamping, or co-molding, may be used.

The keycap portion 602 comprises four apertures 603 that are used to facilitate physically coupling of the keycap portion 602 to the associated keycap. In various embodiments, the apertures 603 are used for alignment, for the insertion of fastening systems, or both. Similarly, the base portion 604 comprises four apertures 605 that are used for to facilitate physically coupling of the base portion 604 to an associated base. The associated base is not illustrated in FIGS. 6A-D. Other embodiments may not have apertures, may have features other than apertures such as indentations or protrusions, or have differently shaped, size, or located apertures.

Figure 6B:
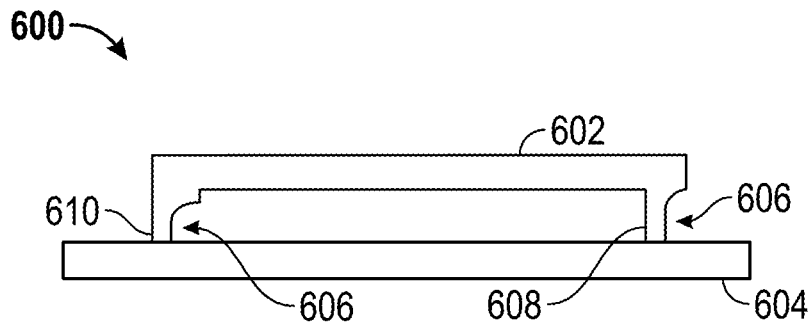
Figure 6C:
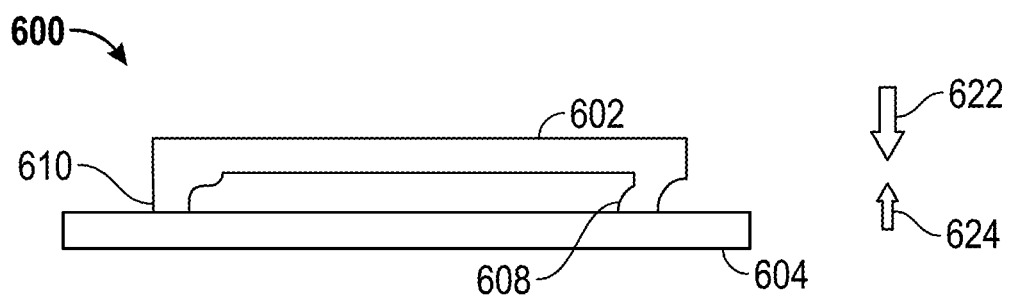
Figure 6D:
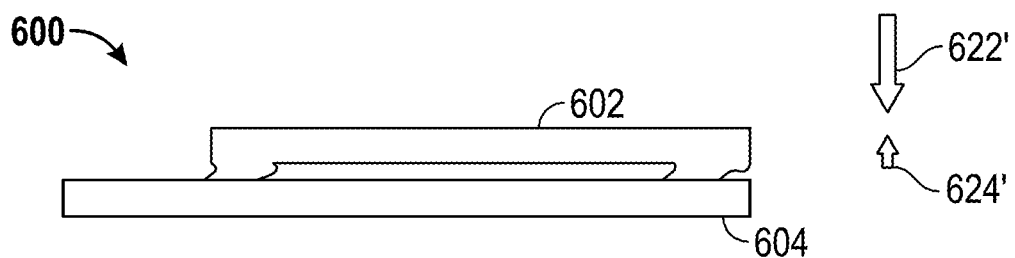

FIGS. 6B-D illustrate the elastic component 600 during movement of an associated keycap coupled to the keycap portion 602 from the unpressed position (FIG. 6B) to the pressed position (FIG. 6D). (The associated keycap is not illustrated in FIGS. 6A-D). In FIG. 6B, no press force is applied to the associated keycap. In FIG. 6C, a press force 622 is applied to the associated keycap and transmitted to the elastic component 610 and compresses the elastic component 610. In response, the elastic component 610 provides a reaction force 624 that resists movement of the keycap portion 602 (and thus the associated keycap coupled to the keycap portion 602) toward the pressed position. The reaction force 624 results primarily from the compression of the first and second intermediate portions (608 and 610) of the elastic component 600. Increases in the press force 622 result in increased resistance to movement due to increases in reaction force 624, until the point that press force become so great (illustrated by the longer arrow 622') that the intermediate portions 608, 610 directionally buckle (in the positive X-direction), at which point the reaction force is greatly reduced (illustrated by the smaller arrow 624'). The increasing resistance followed by a sudden decrease in resistance provides a tactile response for the user that can simulate the "snap-over" effect discussed in connection with FIG. 2. In some embodiments, a relief 606 (FIG. 6B) in each of the intermediate portions 608, 610 is used to facilitate directional buckling of the elastic component, which in turn, allows or causes the lateral movement of the associated keycap in a direction orthogonal to the press direction as the associated keycap moves from the unpressed to the pressed position. As noted above, in response to a removal of the press force 622 or 622', the elastic component 600 applies a reaction force that biases the associate keycap toward the unpressed position.

Figure 7A:
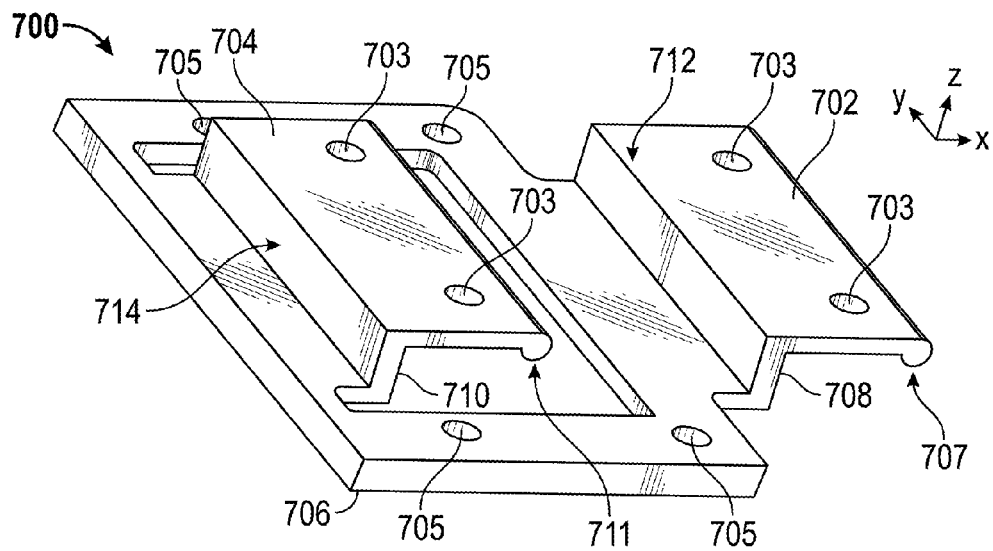
FIGS. 7A-D shows a perspective view and side views of another embodiment of the elastic component.

FIG. 7A illustrates a perspective view of another embodiment of an elastic component 700. The elastic component 700 includes a first keycap portion 702, a second keycap portion 704, a base portion 706 and first and second intermediate portions (708 and 710). Similar to the elastic component 600, the elastic component 700 may be constructed and assembled in various ways. For example, in some embodiments, the elastic component 700 is constructed as an individual component physically separate from any other elastic components and, in other embodiments, the elastic component 700 is constructed as one of a plurality of elastic components formed in a sheet of elastic material. Also similar to the elastic component 600, the first and second keycap portions 702, 704 each comprises apertures 703, and the base portion 706 comprises apertures 705. These apertures 703, 705 may be used to facilitate physical coupling, and may not exist in some embodiments.

The first and second keycap portions 702, 704 each comprise a rounded end 707, 711, respectively. In some embodiments, the rounded ends 707, 711 are configured to physically contact an associate base or other component to provide cushioning as the associate keycap reaches the pressed position. In other embodiments, the rounded ends 707, 711 does not have such a cushioning function, have some other shape, or does not exist. The first keycap portion 702 has a first edge 712. The first intermediate portion 708 couples to or joins with the first keycap portion 702 near to or along this first edge 712, and the first intermediate portion 708 then extends down to the base 706. In a similar arrangement, the second keycap portion 704 has a second edge 714. The second intermediate portion 710 couples to or joins with the second keycap portion 704 near to or along this first edge 714, and the second intermediate portion 710 then extends down to the base 706.

Figure 7B:
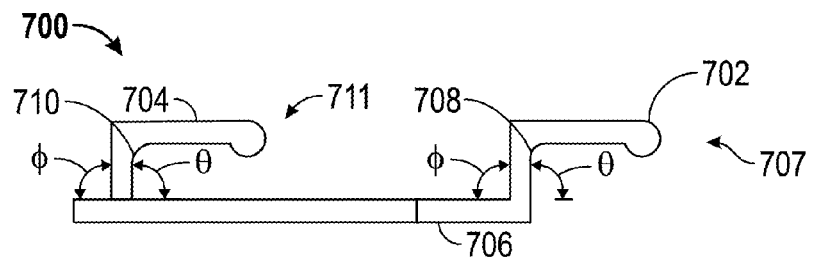
Figure 7C:
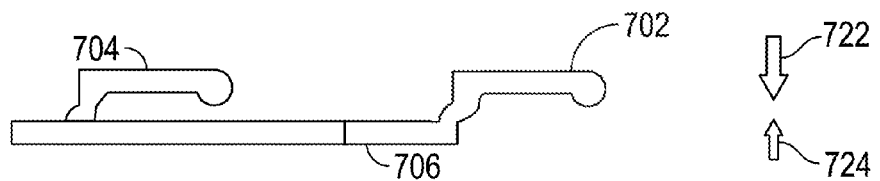
Figure 7D:
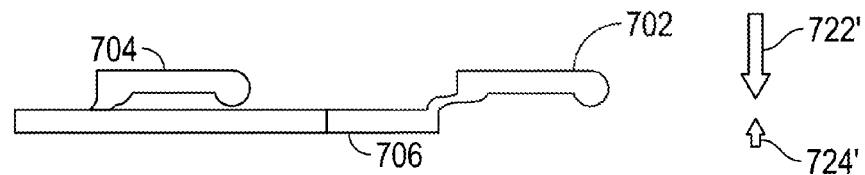

FIGS. 7B-D illustrate the elastic component 700 during movement of an associate keycap from the unpressed position (FIG. 7B) to the pressed position (FIG. 7D). In the embodiment of FIG. 7B, the directional buckling is facilitated by the first and second intermediate portions (708 and 710) being positioned at an angle $\theta$ and an angle $\phi$ between the surface of the base 706 and the edge of the intermediate portions 708, 710 as shown. In some embodiments, the angles $\theta$ and $\phi$ are supplementary. Some embodiments where intermediate portion 708 (or 710) is similar in thickness near the base portion 706 and at the keycap portion 702 (or 704), such as where the intermediate portion 708 (or 710) is of constant thickness, has such supplementary angles $\theta$ and $\phi$. In some embodiments, the angles $\theta$ and $\phi$ are not supplementary. Some embodiments where the intermediate portion 708 (or 710) varies in thickness from the base portion 706 to the keycap portion 702 (or 704) has such non-supplementary angles $\theta$ and $\phi$. Further, although the elastic component 700 has intermediate portions 708, 710 that positioned at a same angle $\theta$ and a same angle $\phi$, other embodiments may have intermediate portions positioned with unequal angles. In some embodiments, the angle $\theta$ is approximately 85°, but may be any appropriate angle in other embodiments, such as an angle in a range of 60°-90°. In some embodiments, the angle $\phi$ is approximately 95°, but may be any appropriate angle in other embodiments, such as an angle in range of 90°-120°. In FIG. 7C, a press force 722 is applied and a reaction force 724 resists movement of the first and second keycap portions 702, 704 (and thus the associated keycap coupled to the keycap portions) toward the pressed position. The reaction force results primarily from the compression of the first and second intermediate portions (708 and 710) of the elastic component 700. Increases in the press force 722 results in increased resistance due to the reaction force 724, until the point that press force become so great (illustrated by the longer arrow 722') that the intermediate portions 708, 710 buckle, at which point the reaction force is greatly reduced (illustrated by the smaller arrow 724'). It will be appreciated that for some touchsurfaces (for example, for smaller keys such as some function keys of keyboards) the elastic component may be implemented with only one keycap portion and its corresponding intermediate portion (e.g., 702 and 708, or 704 and 710).

Figure 8:
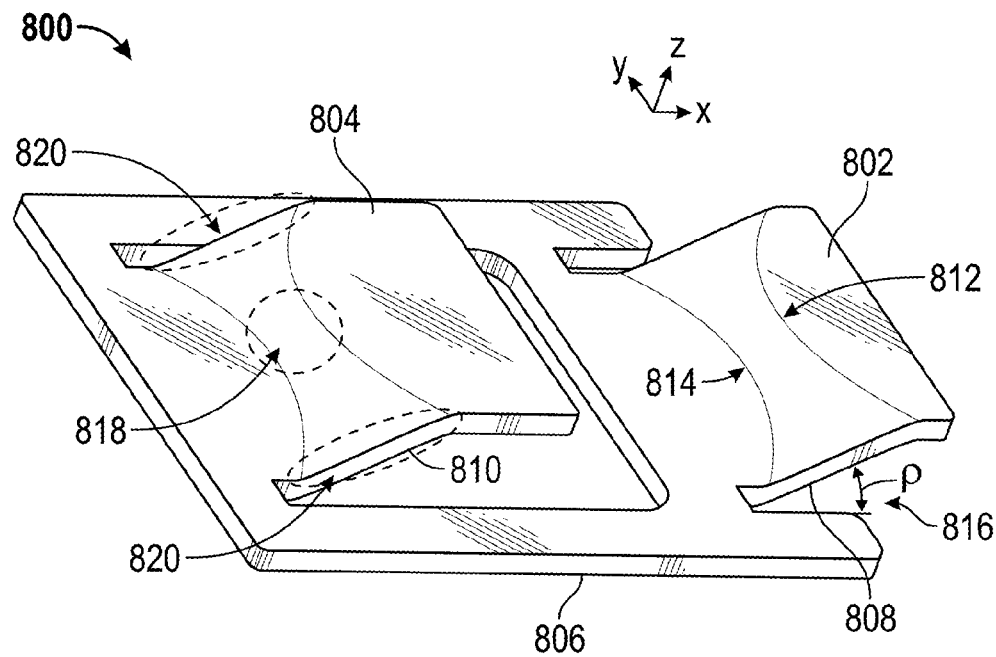
FIG. 8 shows a perspective view of another embodiment of the elastic component.

FIG. 8 illustrates a perspective view of another embodiment of an elastic component 800. The elastic component 800 includes a first keycap portion 802, a second keycap portion 804, a base portion 806 and first and second intermediate portions (808 and 810). Similar to the elastic component 600, the elastic component 800 may be constructed and assembled in various ways. For example, in some embodiments, the elastic component 800 is constructed as an individual component physically separate from any other elastic components and, in other embodiments, the elastic component 800 is constructed as one of a plurality of elastic components formed in a sheet of elastic material.

In the embodiment of FIG. 8, the directional buckling is facilitated by the configuration or shape of the intermediate portions 808, 810. The first and second keycap portions 802, 804 join with the first and second intermediate portions 808, 810 along an arc 812. Similarly, the base portion 806 join with the first and second intermediate portions 808, 810 along an arc 814. The radii of the arcs 812 and 814 may vary significantly between different embodiments, and be selected depending upon the particular implementation. In some embodiments, 10-30 mm arc radii are associated with the arcs 812, 814, and Y-dimension widths of 10-15 mm are associate with the intermediate portions 808 and 810. In some embodiments, the arcs are replaced in whole or in part with nonlinear curves of variable radii, or linear sections.

This configuration provides a center section (e.g., center section 818) that is more vertical and makes a larger angle with the base portion 806 than the edges (e.g., edges 820). Thus, in this embodiment, the angle between the second intermediate portion 810 and the base portion 806 varies across the Y-dimension width of the second intermediate portion 810. This angle may be in a range of 20°-60° along the edges 820 of the second intermediate portion 810 and be in a range of 60°-90° near the center section 818. The first intermediate portion 808 may be similarly constructed, such that an angle p 816 near the edge of the first intermediate portion 808 may make an angle in a range of 20°-60°, and an angle (not labeled) near the center of the first intermediate portion 808 may make an angle in a range of 60°-90°. In other embodiments, these angles may differ from the ranges described above, or differ between intermediate portions.

In some embodiments, the thickness of the intermediate portions 808, 810 may vary from edge to edge, or from the base portion 806 to their respective keycap portion 802, 804.

Upon initial application of a press force to the associated keycap, the center section 818 of the intermediate portion 810 is in compression, while the edge portions 820 are in tension. With sufficient press force, the center section 818 directionally buckles to allow or effect the lateral motion of the associated keycap toward the pressed position. The edge portions 820 are in tension before, during, and after the buckling, and help provide the reaction forces that return the associate keycap to the unpressed position in response to a removal of the press force.

Figure 9:
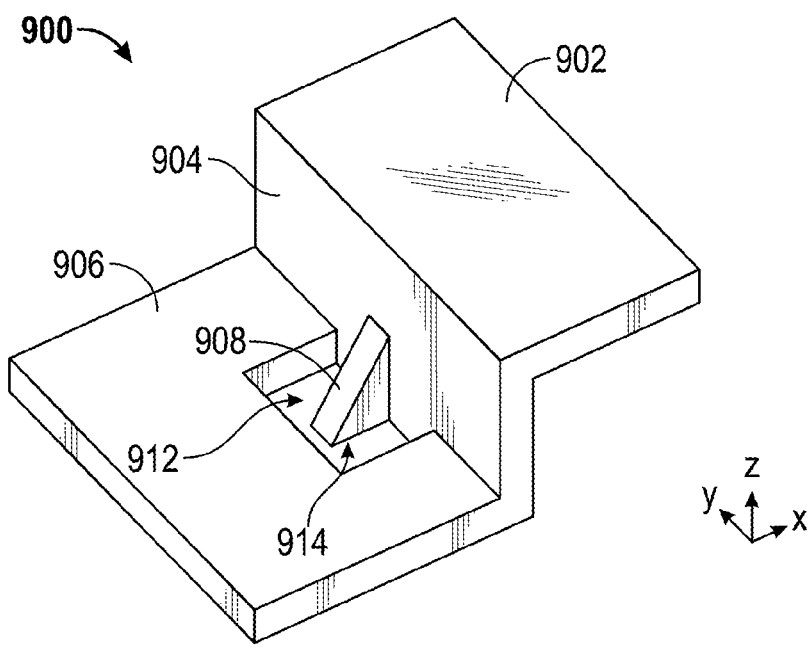
FIG. 9 shows a perspective view of another embodiment of the elastic component.

FIG. 9 illustrates a perspective view of another embodiment of an elastic component 900. The elastic component 900 includes a keycap portion 902, a base portion 906 and an intermediate portion 904. Similar to other elastic components 600, 700, 800 described earlier, in some embodiments, the elastic component 900 may be constructed as an individual component and in other embodiments, the elastic component 900 may be one of a plurality of elastic components formed in a sheet of elastic material. The elastic component 900 also includes a support (or buttress) 908. The buttress 908 extends from the intermediate portion 904 along a center section of the intermediate portion 904. The buttress 908 is configured to extend through an opening (or aperture) 912 in the base portion 906 such that the face 914 of the buttress 908 contacts the base that the base portion 906 is attached to.

Upon application of a press force to the associate keycap, the intermediate portion 904 begins to compress. The buttress 908 helps resist buckling of the intermediate portion 904 in the negative X-direction. In some embodiments, the buttress 908 may also strengthen the intermediate portion 904 such that the press force needed to cause the intermediate portion 904 to buckle in the positive X-direction is greater. In this way, the buttress 908 facilitates directional buckling in a preferred direction, and may increase the press force needed to buckle the elastic component 900.

In operation, increasing press force meets with increased reaction force until the point where the intermediate portion 904 directionally buckles in the positive X-dimension. In the embodiment illustrated in FIG. 9, the directional buckling is facilitated by the buttress resisting movement in the negative X direction. Where the face 914 is attached to the base, the pressed position puts the buttress 908 in tension, which helps to provide reaction forces to return to the unpressed position in response to a removal of the press force. Where the face 914 of the buttress 908 is not attached to the base, the face 914 rises partially or entirely away from the base and the contribution of the buttress 908 to the return force is reduced. Upon release of the press force, the elastic nature of the elastic component 900 biases the keycap portion 902 (and thus the associated keycap) toward the unpressed position. Different embodiments may use any appropriate ratio of elastic components 900 to keycaps. In some laptop keyboard embodiments, smaller keycaps (e.g., keycaps for some function keys) are each supported by only one elastic component 900, while larger keycaps (e.g., keycaps for some alphanumeric keys) are each supported by two elastic components 900 positioned in the direction of buckling. Meanwhile, even larger keycaps (e.g., for the enter, return or spacebar keys), even more elastic components 900 may be used.

Figure 10A:
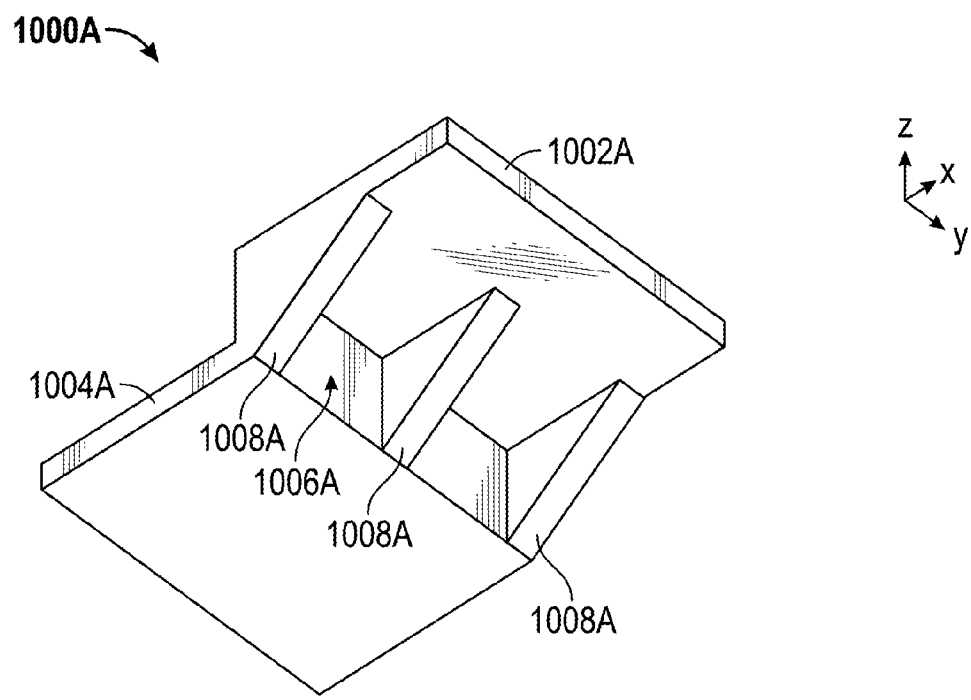
FIGS. 10A-B shows a perspective view and side views of another embodiment of the elastic component.

FIG. 10A illustrates another embodiment of an elastic component 1000A that present some of the variations of the elastic component 900 (FIG. 9) possible. The elastic component 1000A includes a keycap portion 1002A, a base portion 1004A and an intermediate portion 1006A. In this embodiment, analogs to the opening 912 and buttress 908 are not present, but may be included in other embodiments. The elastic component 1000A includes ribs 1008A that shape the reaction forces and the directional buckling of the elastic component 1000A. Generally, the ribs 1008A increase the press force needed to cause the elastic component 1000A to buckle.

Figure 10B:
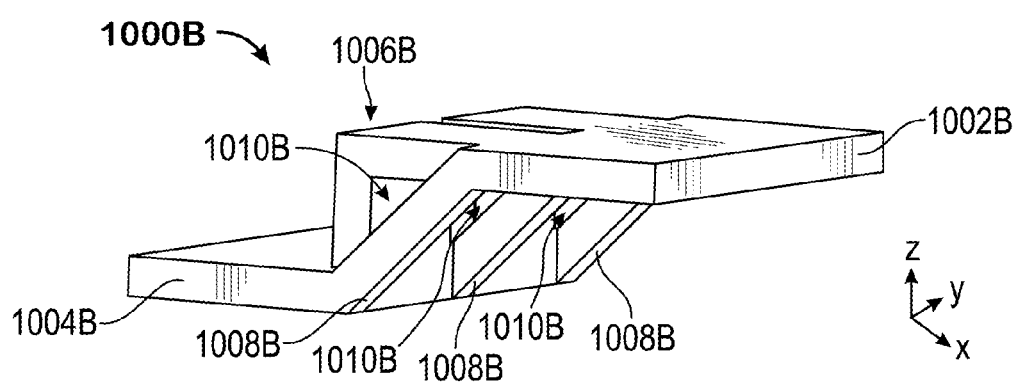

In a variation illustrated in FIG. 10B, an elastic component 1000B comprises a keycap portion 1002B and a base portion 1004B separated by an intermediate portion 10006B. The elastic component 1000B includes openings (or voids) 1010B in the intermediate portion 1006B such that less material comprise the ribs 1008B and other parts of the intermediate component 1006B when compared to the ribs 1008A and the intermediate component 1006A of the elastic component 1000A. Generally, the openings 1010B decrease the press force needed to cause the elastic component 1000B to buckle as compared to the elastic component 1000A of FIG. 10A.

Similar to the elastic component 900, different embodiments utilizing the elastic component 1000A or the elastic component 1000B may use any appropriate ratio of elastic components 1000A, 1000B to keycaps.

Figure 11:
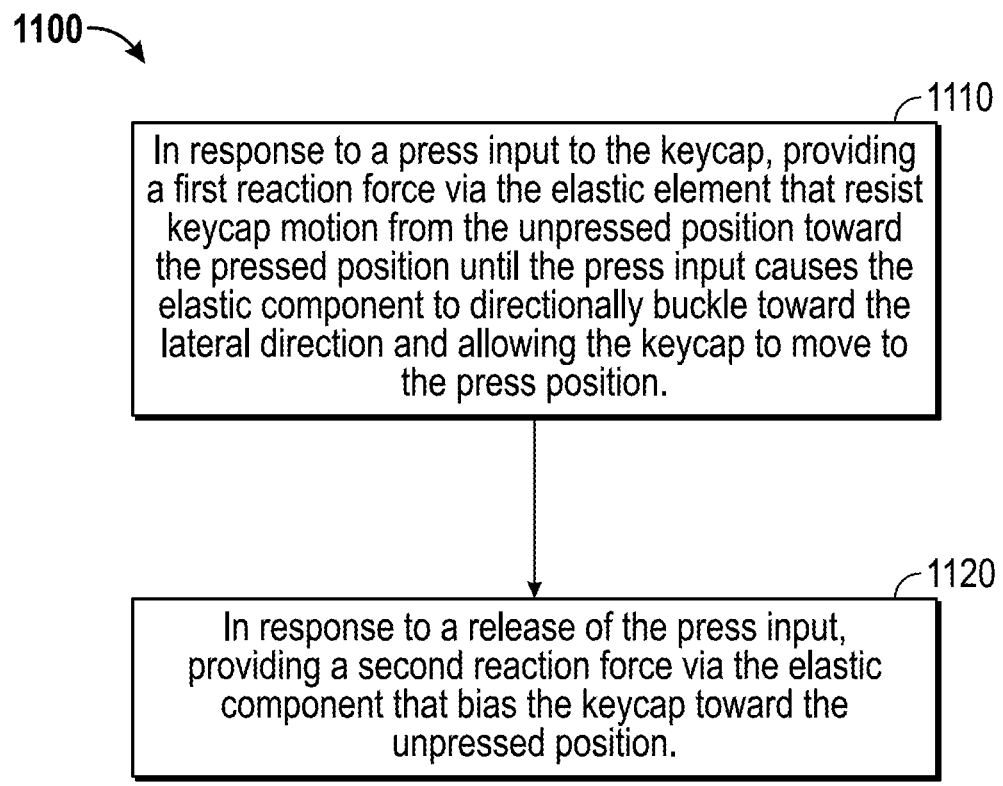
FIG. 11 is flow chart illustrating a method that can be used for affecting motion of a pressable touchsurface of an example touchsurface assembly.

FIG. 11 shows an example method 1100 that can be used for effecting motion of a pressable touchsurface of a touchsurface assembly, such as, in some embodiments, the keycap of a key assembly. The pressable touchsurface is configured to move between an unpressed position and a pressed position relative to a base of the key assembly, where the unpressed and pressed positions are separated in a press direction and in a lateral direction orthogonal to the press direction.

Step 1110 comprises providing, in response to a press input to the keycap, first reaction forces via the elastic element that resist keycap motion from the unpressed position toward the pressed position until the press input causes the elastic component to directionally buckle toward the lateral direction and allowing the keycap to move to the press position.

Step 1120 comprises providing, in response to a release of the press input, second reaction forces via the elastic component that bias the keycap toward the unpressed position.

Thus, the techniques described herein can be used to implement any number of devices utilizing different touchsurface assemblies, including a variety of keyboards each comprising one or more key assemblies in accordance with the techniques described herein. For example, some embodiments of keyboards comprises a base, a plurality of key assemblies, and a key sensor. The key sensor is configured to detect pressed states of one or more keycaps of the plurality of key assemblies. At least one key assembly of the plurality of key assemblies comprises a keycap, a base and an elastic component between the keycap and the base. The keycap is configured to move between an unpressed position and a pressed position relative to the base, where the unpressed and pressed positions are separated vertically (in a press direction) and laterally (in a second direction orthogonal to the press direction). In various embodiment, the elastic component includes a base portion, one or more keycap portions and one or more intermediate portions. The intermediate portions may be positioned at various angles and/or provided with reliefs, ribs, buttresses, or other features to allow or cause directional buckling in a direction orthogonal to the press direction. The elastic component may provide readying function, returning function, and/or PTE function by itself or in combination with other mechanisms. For example, guides comprising parts of any of the PTE mechanisms may be used in combination with elastic components to guide a touchsurface between the unpressed position and the pressed position. As a specific example, ramps and ramp contacting features similar to those discussed in connection with FIG. 3 may be used. In various embodiments, these ramps and ramp contacting features provides no leveling function, or provides leveling function that keeps the touchsurface substantially level during movement between the unpressed and pressed positions.

In some embodiments, the first and second initial reaction forces produced in response to an initial part of the keycap motion from the unpressed position to the pressed position provide an initial tactile response comprising an increasing resistance. Meanwhile, in some embodiments, first and second subsequent reaction forces produced in response to a subsequent part of the keycap motion from the unpressed position to the pressed position provide a subsequent tactile response comprising a decreasing resistance.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer.

As another example of variations, although many of the elastic components shown in the figures have linear outlines or rectilinear features, other embodiments may comprise other shapes. As yet another example of variations, although many of the examples are presented in discussion with key assemblies and keycaps, the techniques described are readily applied to non-key touchsurface assemblies and touchsurface caps.

As further examples of variations, although some of the elastic components discussed herein are illustrated without any apertures similar to 603, 605 of the elastic component 600, some embodiments of these elastic components may have such coupling-facilitating apertures or features. Also, some embodiments of elastic components comprise intermediate portions having a first thickness near a base portion and a second thickness near the keycap portion, where the second thickness being thinner than the first thickness or vice versa. Further, some embodiments of elastic components comprises more or fewer ribs, apertures, or buttresses than shown in the examples shown in the figures. Additionally, some embodiments of elastic components comprise slits, slots, openings, protrusions, depressions, reliefs, and other features in addition to the ones shown. For example, some embodiments of the elastic component 600 comprises cutout in the intermediate portions 608, 610, such that the intermediate portion 608, 610 each resemble two short beams extending between the base portion 604 and the keycap portion 602.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions.

What is claimed is:

1. A key assembly, comprising:
   a keycap;
   a base; and
   an elastic component coupled to the keycap and the base, the elastic component disposed between the keycap and the base, the elastic component supporting the keycap away from the base in an unpressed position, and directionally buckling during movement of the keycap toward a pressed position responsive to a press force;
   wherein the press force moves the keycap in a press direction perpendicular to the base toward the pressed position, and the directionally buckling of the elastic component allows the keycap to move in a second direction orthogonal to the press direction; and
   wherein the elastic component moves the keycap toward the unpressed position after release of the press force.

2. The key assembly of claim 1, wherein the directionally buckling of the elastic component causes the keycap to move in a second direction orthogonal to the press direction.

3. The key assembly of claim 1, wherein the elastic component provides increasing resistance to increases in the press force until the directionally buckling of the elastic component.

4. The key assembly of claim 1, wherein the elastic component comprises:
   a keycap portion coupled to the keycap;
   a base portion coupled to the base; and
   an intermediate portion located between the keycap portion and to the base portion.

5. The key assembly of claim 4, wherein a center section of the intermediate portion is in tension and first and second edge sections of the intermediate portion are in compression responsive to the press force prior to the directionally buckling of the elastic component.

6. The key assembly of claim 1, wherein the elastic component comprises:
   a keycap portion coupled to the keycap, the keycap portion having a first edge and a second edge;
   a base portion;
   a first intermediate portion extending from near the first edge to the base portion; and
   a second intermediate portion extending from near the second edge to the base portion.

7. The key assembly of claim 1, wherein the elastic component comprises:
   first and second keycap portions each being coupled to the keycap, the first and second keycap portions each having an edge;
   a base portion;
   a first intermediate portion extending from near the first edge to the base portion; and
   a second intermediate portion extending from near the second edge to the base portion.

8. The key assembly of claim 1, further comprising guides that guide the keycap in the press direction and in the second direction during movement of the keycap from the unpressed position toward the press position.

9. The key assembly of claim 8, wherein the guides comprises ramps on the base that interface with ramp contacting features on the keycap to keep the keycap substantially level during movement of the keycap from the unpressed position toward the press position.

10. The key assembly of claim 1, further comprising a capacitive sensor for sensing when the keycap is in the pressed position.

11. The key assembly of claim 1, further comprising a second elastic component coupled between the base and the keycap.

12. A keyboard, comprising:
    a base;
    a plurality of keycaps; and
    a plurality of elastic components coupled to the base, each of the plurality of elastic components also coupled to a respective keycap of the plurality of keycaps and supporting the respective keycap away from the base in an unpressed position, and each of the plurality of elastic components directionally buckling during movement of the respective keycap toward a pressed position responsive to a press force applied to the respective keycap;
    wherein the press force moves the respective keycap in a press direction toward the base and the directionally buckling of the elastic component allows the respective keycap to move in a second direction orthogonal to the press direction; and
    wherein the elastic component moves the respective keycap toward the unpressed position upon release of the press force, wherein each of the plurality of elastic components provides increasing resistance to increases in the press force until the press force causes the directionally buckling of the elastic component.

13. The keyboard of claim 12, wherein each of the plurality of elastic components comprises:
    a keycap portion coupled to the keycap;
    a base portion coupled to the base; and
    an intermediate portion located between to the first portion and to the second portion.

14. The keyboard of claim 12, wherein each of the plurality of elastic components comprises:
    a keycap portion coupled to the keycap, the keycap portion having a first and a second edge;
    a base portion;
    a first intermediate portion extending from near the first edge to the base portion; and
    a second intermediate portion extending from near the second edge to the base portion.

15. The keyboard of claim 12, wherein each of the plurality of elastic components comprises:
    first and second keycap portions each being coupled to the keycap, the first and second keycap portions having an edge;

a base portion;

a first intermediate portion extending from near the first edge to the base portion; and a second intermediate portion extending from near the second edge to the base portion.

16. The keyboard of claim 12, further comprising a capacitive sensor for sensing when each of the plurality of keycaps is in the pressed position.

17. The keyboard of claim 12, wherein at least one of the plurality of keycaps is coupled to at least two of the plurality of elastic components.

18. A method of effecting motion of a keycap of a key assembly, wherein the keycap is supported away from a base by an elastic component disposed between the keycap and the base, the keycap configured to move between an unpressed position and a pressed position relative to the base, wherein the unpressed and pressed positions are separated in a press direction perpendicular to the base and in a lateral direction orthogonal to the press direction, the method comprising:

in response to a press input to the keycap, providing a first reaction force via the elastic element that resists keycap motion from the unpressed position toward the pressed position until the press input causes the elastic component to directionally buckle toward the lateral direction and allowing the keycap to move to the press position; and in response to a release of the press input, providing a second reaction force via the elastic component that bias the keycap toward the unpressed position.

19. The method of claim 18, including providing increasing resistance via the elastic component to increases in the press force until the press force causes the directionally buckling of the elastic component.

* * * * *